United States Patent [19]
Hiraishi et al.

[11] Patent Number: 5,911,826
[45] Date of Patent: Jun. 15, 1999

[54] METHOD FOR PULLING CRYSTAL

[75] Inventors: Yoshinobu Hiraishi; Masafumi Ura, both of Kanagawa, Japan

[73] Assignee: Komatsu Electronic Metals Co., Ltd., Kanagawa, Japan

[21] Appl. No.: 09/099,872

[22] Filed: Jun. 19, 1998

[30] Foreign Application Priority Data

Jun. 19, 1997 [JP] Japan ............................. 9-162263

[51] Int. Cl.$^6$ ................................................ C30B 23/00
[52] U.S. Cl. ........................... 117/200; 117/14; 117/15; 117/217; 117/34
[58] Field of Search ....................... 117/200, 14, 15, 117/217, 34

[56] References Cited

U.S. PATENT DOCUMENTS 5,707,441  1/1998  Namikawa et al. .................. 117/14
5,785,753  7/1998  Taguchi et al. ..................... 117/15
5,817,176  10/1998  Sung et al. ........................ 117/15

*Primary Examiner*—Benjamin Utech
*Assistant Examiner*—Kin-Chan Chen
*Attorney, Agent, or Firm*—Sughrue, Mion, Zinn, Macpeak & Seas, PLLC

[57] ABSTRACT

An electrode is disposed at the lower end of a radiation screen. The electrode is made of single-crystal silicon. A circuit including a power source is established by contacting the electrode and the seed crystal to a silicon melt.

3 Claims, 3 Drawing Sheets

METHOD FOR PULLING CRYSTAL

BACKGROUND OF THE INVENTION

1. Field of the Invention

The present invention relates to a method for pulling crystal which can set a space between the surface of a melt and a radiation screen when pulling crystal, such as silicon single-crystal, by a Czochralski method.

2. Description of the Related Art

Generally, crystal such as silicon single-crystal, is pulled from melt in a crucible made of high-purity quartz glass. It is called Czochralski method. At this time, the quartz glass is melted into the silicon melt, and oxygen atoms are diffused into the melt and brought into the single-crystal. Furthermore, silicon oxide (SiO) is evaporated from the surface of the melt.

On the other hand, recently, since silicon wafers used for manufacturing integrated LSI have been underway, further more precise control on oxygen concentrations of the silicon wafers is demanded. The variation of the space between the surface of the melt and the radiation screen is considered a factor to cause less precise control on oxygen concentrations. Therefore, a method for improving the space control more precise is required.

"Apparatus and Method for Pulling crystal", serving as an improved method for solving this problem, was disclosed in Unexamined Japanese Patent Publication (kokai) No. Hei 7-330484. In this publication, a quartz glass-made measuring device for measuring the position of the surface of a melt is contacted with or dipped into the melt, thereby measuring the height of the surface of the melt by an image process.

However, in practice, to measure the scale of the quartz glass-made measuring device or the dipped part thereof is difficult. Moreover, when the measuring part is at a temperature above 1400° C., contrast is weakened owing to intense radiation. Hence, a high-cost and high-quality image processing device is necessary.

Furthermore, the quartz glass-made measuring device which is easily softened and deformed at a temperature above 1400 ° C., is unable to be used to serve as a measuring device.

In addition, since the measuring device is continuously dipped in the melt under this condition, some crystals grow from the front end of measuring device, so, those disturb correctly growth of single crystal.

SUMMARY OF THE INVENTION

In view of the above, it is an object of the present invention to provide a method for pulling crystal which are able to precisely measure and set the space between the surface of a melt and a radiation screen, and do not cause any deleterious influence to pulling crystal.

In a method for pulling crystal by pulling crystal from the melt by a Czochralski method, first, an electrode disposed on a radiation screen is protruded from the bottom end of the radiation screen by a predicted length. A crucible containing a melt is raised. Whether or not the surface of the melt contacts the electrode to connect the melt to ground through the electrode is detected. Raising the crucible is stopped, if detected. Finally, the space between the surface of the melt and the bottom end of the radiation screen is set to be the predicted length.

Furthermore, a voltage is applied on the melt through a seed crystal which previously contacts the melt. As the melt is connected to the ground, the voltage is detected 0V.

In addition, the electrode is made of the same material as the melt.

DETAILED DESCRIPTION OF THE EMBODIMENT

In this invention, first, an electrode made of the same material as a melt inside a crucible is disposed at the lower end of a radiation screen. The variation of resistance in a circuit formed by contacting both electrode and seed crystal with the melt is detected, wherein a current is produced to flow from a power source to ground. Therefore, the space between the radiation screen and the surface of the melt, equal to a set value, is detected. This will be described accompanying FIGS. 3A and 3B in the following.

Figure 1:
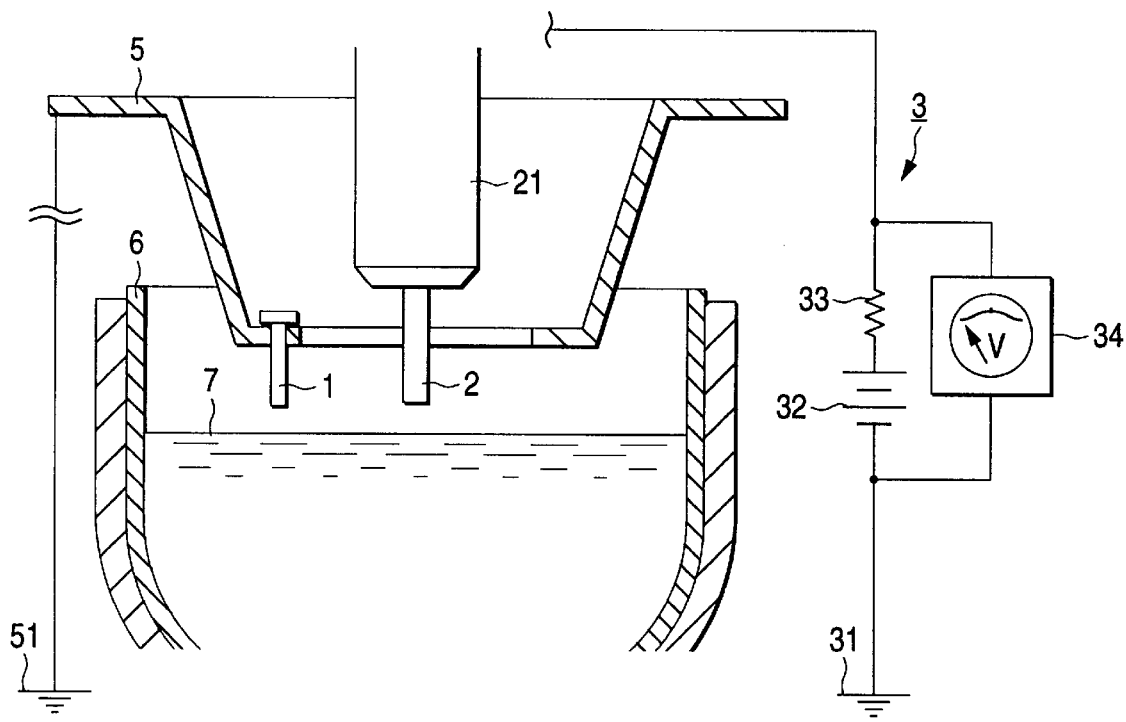
FIG. 1 is a schematic view showing a pulling apparatus according to the invention.
Figure 2A:
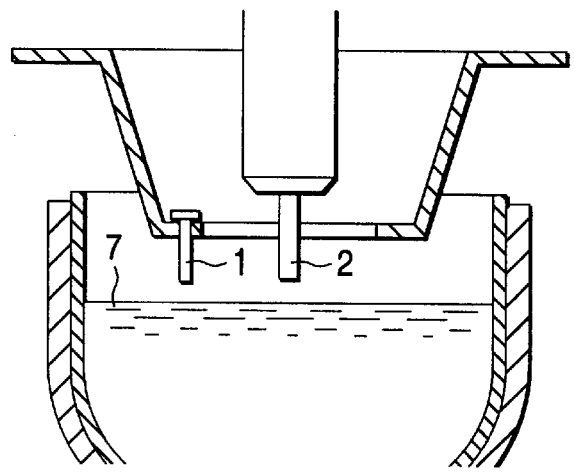
FIGS. 2A to 2C are schematic views showing the order of height adjustment of a crucible.
Figure 2B:
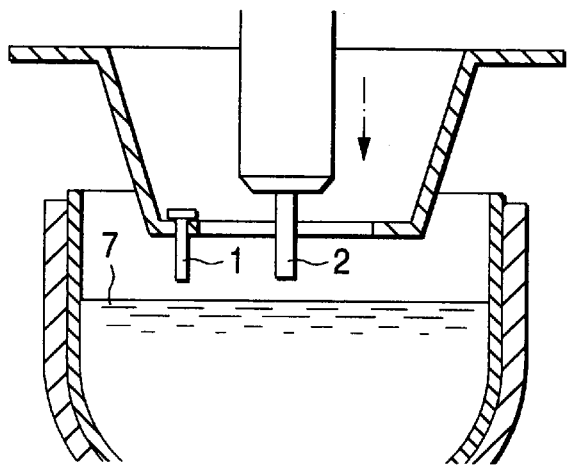
Figure 2C:
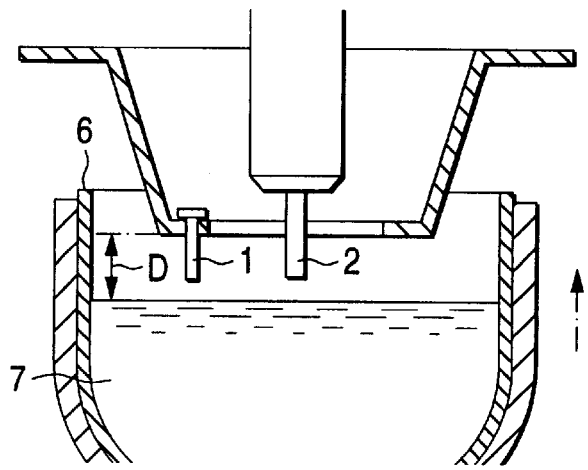
Figure 3A:
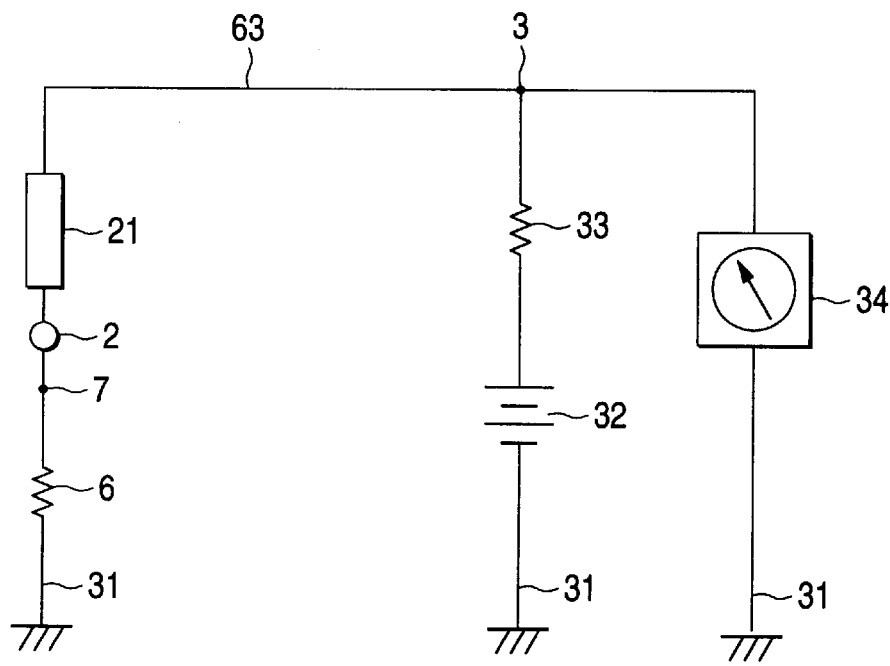
FIGS. 3A and 3B are equivalent circuits of FIGS. 1 and 2, respectively.
Figure 3B:
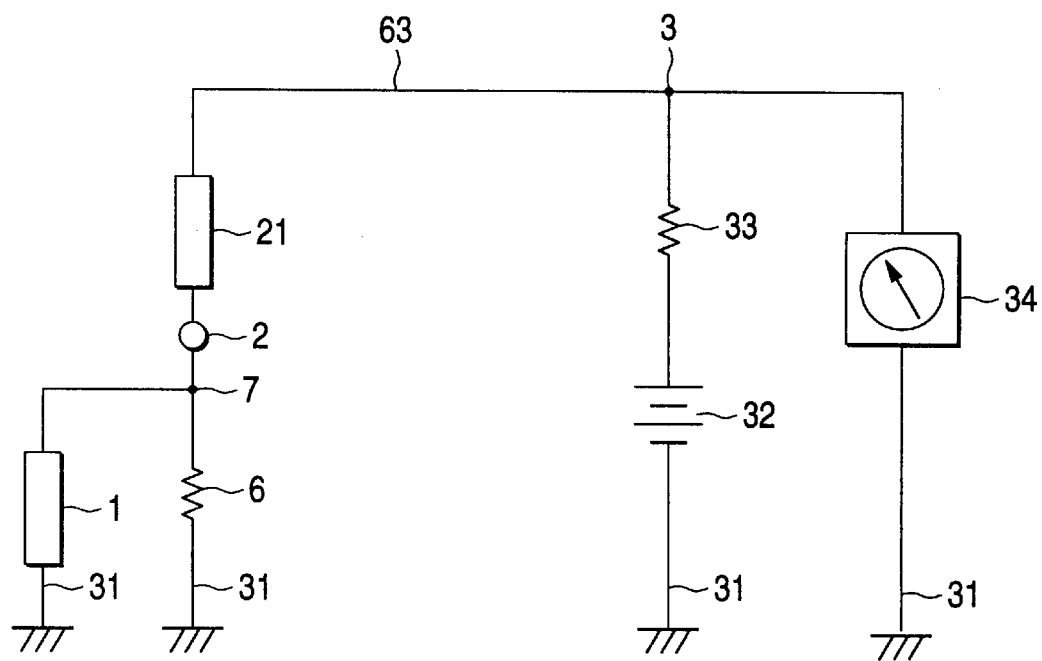

FIGS. 3A and 3B are equivalent circuits of FIGS. 1 and 2, respectively. FIG. 3A shows a state in which only seed crystal 2 contacts a melt 7. A current flows from a power supply 32 (with respect to ground 31) to ground 31 through a resistor 33, a seed crystal holder 21, a seed crystal 2, the melt 7 and a crucible 6. The resistance of the crucible 6 having a diameter of over 500 mm is less than several kΩ at a melting temperature of silicon.

That is, a voltage measured by a voltage-measuring device 34 is a voltage-divided value obtained by dividing the voltage of the power source with the resistor 33 and the crucible 6 in the state of FIG. 3A.

FIG. 3B shows a state in which both seed crystal 2 and electrode 1 contact the melt 7. In this case, the melt 7 is connected to the ground 31 via a radiation screen made of graphite by using the electrode 31. Hence, the crucible 6 is connected to the ground 31 by using the electrode 1, and the resistance from cable 63 to ground 31 is approximately equal to 0.

When the voltage of the power source 32 is 24V, the resistance of the resistor 33 is of 12 KΩ and the diameter of the crucible 6 is 560 mm, the voltage measured by the voltage-measuring device 34, such as a voltmeter, is approximately 2.5V in the state of FIG. 3A, while is approximately 0V in the state of FIG. 3B, thereby being able to determine whether or not the electrode 1 contacts the melt 7.

Moreover, even though the front end of the electrode made of the same material as the melt is melted right after the electrode contacts the melt, it does not cause any influence to the composition of the melt. Consequently, the electrode is separated from the surface of the melt owing to surface tension. Hence, no deleterious influence on pulling crystal and no problem on quality are incurred.

Next, an embodiment of the invention will be described accompanying the drawings hereinafter.

As shown in FIG. 1, an apparatus of the embodiment is used for pulling silicon single-crystal. The pulling apparatus is constituted by a crucible 6 containing a silicon melt 7, a seed crystal holder 21 holding a seed crystal 2 which is used to pull crystal (not shown), a radiation screen 5 for shielding heat emitted from a heater (not shown), an electrode 1 disposed at the lower end of the radiation screen 5, and a voltage-measuring device 3 connected to the seed crystal 2 via a wire (not shown).

The electrode 1 is made of the same silicon as the pulled crystal. As an expected space distance between the radiation silicon 5 and the surface of the silicon melt 7 is reached, the lower end of the electrode 1 contacts the silicon melt 7 by using its length. In addition, the diameter of the electrode is less than 10 mm so that the lower end of the electrode 1 is separated from the surface of the melt right after the lower end of the electrode 1 contacts the silicon melt 7.

The electrode 1 protrudes from the lower end of the radiation screen by a predicted length when being inserted from a punch-through hole located at the lower end of the radiation screen. For hanging and fixing the electrode 1, a pin-shaped part having a diameter of more than that of the punch-through hole is formed. Although a used electrode must be replaced with a new one for each pulling process, since the length of the electrode 1 with a diameter of less than 10 mm is never more than 50 nm, electrodes can be inexpensively manufactured. Therefore, an increase of manufacturing cost can completely be neglected.

Moreover, the radiation screen 5 made of low-resistance carbon and disposed in a pulling apparatus, is connected to ground 51, which is stainless.

One end of the voltage-measuring device 3 is connected to the ground 31 while the other end of which is connected to the seed crystal 2. In the pulling apparatus, the detection of a conductive state is executed by measuring a voltage across the power source 32 and the resistor 33 by using a voltmeter 34 when the circuit is established.

Next, a method to adjust the height of the surface of the silicon melt 7 inside the crucible 6 by voltage-measuring will be described in the following.

As shown in FIG. 2A, it starts from a state in which the electrode 1 and the seed crystal 2 do not contact the silicon melt 7. As shown in FIG. 2B, the seed crystal 2 is lowered, so that the lower end of the seed crystal 2 is able to contact the silicon melt 7.

As shown in FIG. 2C, if the crucible 6 is raised until the space D between the surface of the silicon melt 7 and the lower end of the radiation screen 5 is reached, the measured value of the voltage-measuring device 3 is varied once the electrode 1 contacts the melt 7. That is, before the contacting, the voltage of the voltage-measuring device is about 2.5V while after the contacting, the voltage of the voltage-measuring device is about 0V. At this point, the space between the surface of the silicon melt 7 and radiation screen 5 is equal to the predicted value D.

The current position of the crucible 6 is taken as a standard. Starting the process for pulling crystal, the variation of the value D from batches to batches pulled can be controlled within a minimum range.

Generally, it is needed to have different lengths of electrodes when different values D are set by the above-mentioned method. However, if electrodes with the same lengths are used, the crucible is moved only by a predicted distance, then the pulling process can start after the standard value D is detected.

Accordingly, various set values D can be repeatedly obtained for one kind of electrode. In the embodiment, the result of ten times of tests where D is set 25 mm, is that the oxygen concentration in crystal sensitive to the D value is half time that in the conventional art.

Moreover, if the electrode 1 contacts the melt 7 with ten seconds passing by, around 5 mm of contacting part is melted. Since the electrode 1 is separated from the melt, no deleterious influence on pulling crystal as described in the conventional art is incurred.

In addition, a measured voltage by the voltage-measuring device 3 is back to the before-contacting voltage. However, even though a voltage is applied on the melt 7, no deleterious influence on pulling operation occurs. Since the power source 32 is cut off from the circuit, this measured voltage is easily back to 0V.

In the embodiment, the contact between the electrode 1 and the silicon melt 7 is detected by measuring the variation of a divided voltage by using the resistor 33. However, if a constant-current source functioning as the power source 32 is used, the resistor 33 can be removed. In this condition, the contact can be exactly detected by measuring the amplitude of voltage variation.

Furthermore, by inserting a galvanometer into the circuit instead of the resistor 33, the contact can be determined by the variation of a current value. In this case, since the power source is short-circuited upon contacting, an additional current-limiting circuit for preventing an extra current flow is needed.

The advantages of the invention will be described as follows:

(1) the space between the surface of the melt and the radiation screen is able to be precisely measured and correctly set.

(2) the invention is suitable for the use of the pulling apparatus of the prior art without the need of a high-cost and high-quality image processing device.

(3) after setting the space between the melt and the radiation screen, no deleterious influence on pulling crystal is incurred, because the electrode is melted and then separated from the surface of the melt.

What is claimed is:

1. A method for pulling crystal by pulling crystal from a melt by a Czochralski method comprising the steps of:

protruding an electrode disposed on a radiation screen, from the bottom end of said radiation screen by a length;

raising a crucible containing said melt;

detecting whether or not the surface of said melt contacts said electrode to connect said melt to ground through said electrode, and stopping raising said crucible, if detected; and setting the space between the surface of said melt and the bottom end of said radiation screen to be said length.

2. A method for pulling crystal as claimed in claim 1 further comprising the steps of:

applying a voltage on said melt through a seed crystal which previously contacts said melt in said detecting step whether or not said melt is connected to said ground; and detecting said voltage is 0V when said melt is connected to said ground.

3. A method for pulling crystal as claimed in claim 1, wherein said electrode is made of the same material as said melt.

* * * * *